United States Patent [19]

Ehiro

[11] Patent Number: 5,970,074
[45] Date of Patent: Oct. 19, 1999

[54] METHOD AND APPARATUS FOR MEASURING THRESHOLD CHARACTERISTIC OF SEMICONDUCTOR INTEGRATED CIRCUIT

[75] Inventor: Masayuki Ehiro, Nara, Japan

[73] Assignee: Sharp Kabushiki Kaisha, Osaka, Japan

[21] Appl. No.: 08/670,492

[22] Filed: Jun. 27, 1996

[30] Foreign Application Priority Data

Jul. 21, 1995 [JP] Japan ................................. 7-186051

[51] Int. Cl.⁶ .................................................. G01R 31/30
[52] U.S. Cl. ............................................................ 371/28
[58] Field of Search ............................... 371/28; 364/483, 364/551.01; 361/79, 86, 87; 340/853.2; 324/76.11, 158.1

[56] References Cited

U.S. PATENT DOCUMENTS

| | | | |
|---|---|---|---|
| 4,375,072 | 2/1983 | Rice | 361/87 |
| 4,488,106 | 12/1984 | Chernotsky et al. | 323/239 |
| 4,503,538 | 3/1985 | Fritz | 371/28 |
| 5,262,683 | 11/1993 | Cook | 371/28 |
| 5,448,492 | 9/1995 | Kolomyski et al. | 371/28 |
| 5,483,232 | 1/1996 | Clark, Jr. et al. | 340/853.1 |

FOREIGN PATENT DOCUMENTS

63-308364 12/1988 Japan .

Primary Examiner—Hoa T. Nguyen

[57] ABSTRACT

To measure the threshold characteristics of an integrated circuit processing a Schmitt circuit at the input side, a clock signal generated from a signal generator is fed to the integrated circuit, and a change of a power source current supplied from a power source circuit to the integrated circuit is detected by a change detector. A control circuit sets the amplitude of a clock signal generated by a driver circuit through digital-to-analog converting circuits. Initially, the voltages of the signal at the high level side and low level side are both set at 0.00 V, and when the voltage of the signal at the high level side, increasing by 0.01 V at a time, reaches the threshold of the Schmitt circuit, a large power source current flows, and a voltage change between the ends of a resistor is detected. As a part of a function test of a test apparatus, the threshold characteristic of the integrated circuit is measured.

15 Claims, 5 Drawing Sheets

METHOD AND APPARATUS FOR MEASURING THRESHOLD CHARACTERISTIC OF SEMICONDUCTOR INTEGRATED CIRCUIT

BACKGROUND OF THE INVENTION

1. Field of the Invention

The present invention relates to a semiconductor integrated circuit of CMOS or the like having a state transition circuit such as a Schmitt circuit at the input side thereof.

2. Description of the Related Art

Hitherto, a Schmitt circuit is often provided at the input side of a semiconductor integrated circuit as an anti-noise measure. The Schmitt circuit, which is also known as Schmitt trigger circuit, possesses hysteresis characteristic with respect to response characteristic of output voltage to input voltage, and the threshold differs between the case where an input voltage changes from the low voltage side to the high voltage side and the case where the input voltage changes from the high voltage side to the low voltage side. Once an input voltage which is changing from the low voltage side to the high voltage side exceeds the threshold, the threshold for a following change of the input voltage from the high voltage side to the low voltage side is lower by the amount of hysteresis. If state transition is caused after the threshold is exceeded, state transition does not occur again unless the input voltage is changed to a very low voltage side, and therefore, even if noise is contained in the input voltage, state transition due to noise hardly takes place. The greater the difference of threshold due to hysteresis, the stronger becomes the resistance to noise. The output of such a Schmitt circuit is, however, connected inside the semiconductor integrated circuit, and cannot be directly observed from outside. Therefore it is difficult to measure the hysteresis characteristic width.

As conventional methods of measuring the hysteresis characteristic width are employed, for example, a method of incorporating a test facilitating circuit in a semiconductor integrated circuit as disclosed in Japanese Unexamined Patent Publication JP-A 63-308364 (1988), and a method of testing the function while gradually changing the input level at specific voltage width increments and measuring the hysteresis characteristic indirectly from the result of judgment. In the method incorporating the test facilitating circuit, however, the chip area of the semiconductor integrated circuit increases, and the cost of a device as a semiconductor integrated circuit rises. In a semiconductor integrated circuit allowing a free specification change by a user, such as a gate array, the test facilitating circuit may not be incorporated due to a limited number of gates. In the method of measuring the characteristic indirectly by function test, the function test must be executed plural times, and the time required for test is very long. Accordingly, the test processing efficiency is lowered and the cost for testing is increased.

A prior art method for avoiding such problems is disclosed, for example, in Japanese Unexamined Patent Publication JP-A 63-238474 (1988), in which the power source current is monitored by sweeping the input voltage of a Schmitt circuit and changing the level in the course of time, and compared with a specific threshold to detect an input voltage which exceeds the specific threshold as a threshold showing hysteresis characteristic to judge the operation state of the Schmitt circuit. According to this prior art method, the test facilitating circuit is not needed, and the characteristic of the Schmitt circuit can be measured only by a direct current measuring function without a function test. It is, however, necessary to repeat the operations of measuring the power source current and comparing the measured value with the threshold, and it takes a long time to measure the power source current stably, and hence the test time is not curtailed.

As described above, the prior art methods of measuring the threshold characteristic have drawbacks such as an increase of chip cost for incorporating the test facilitating circuit as disclosed in JP-A 63-308364, and an increase of test time due to direct-current test as disclosed in JP-A 63-238474.

SUMMARY OF THE INVENTION

It is hence a primary object of the invention to provide a method and an apparatus for measuring threshold characteristic of semiconductor integrated circuit, capable of shortening the time required for measurement without incorporating any particular circuit in the semiconductor integrated circuits.

The invention therefore provides a method for measuring threshold characteristic of a semiconductor integrated circuit possessing an input circuit whose operational state is shifted depending on whether an input signal voltage is above or below a threshold, wherein a clock signal having a predetermined reference voltage which is much greater than or less than an estimated threshold voltage and a peak voltage which is varied toward the approximate threshold, from the predetermined reference voltage, is repeatedly fed as an input signal, the peak voltage of the clock signal is sequentially changed by a predetermined amount each clock cycle, and the peak voltage resulting in a current supplied from a power source to the semiconductor integrated circuit which varies beyond a predetermined range, is measured as the threshold. According to the invention, a clock signal having a predetermined reference voltage which is much greater than or less than an estimated threshold voltage and a peak voltage which is incremented or decreased toward the estimated threshold voltage, from the predetermined reference voltage, is repeatedly fed to the semiconductor integrated circuit. The peak voltage of the clock signal is sequentially changed by a predetermined amount each clock cycle. When the peak voltage is changed to the other side of the threshold, the input circuit in the semiconductor integrated circuit undergoes state transition, and a large change occurs in the power source current along with the state transition. The peak voltage at the time of the change of the power source current is measured as the threshold, so that the threshold characteristic can be measured promptly without particularly adding a circuit for facilitating measurement at the semiconductor integrated circuit side.

In the invention, hysteresis characteristic of the voltage as the threshold is different between the case where the input signal voltage changes from high voltage side to low voltage side, and the case where the input signal voltage changes from low voltage side to high voltage side.

A first threshold is measured by taking one of the high and low side voltages of the clock signal as a reference voltage, and changing the peak voltage of the clock signal to the other voltage side. A second threshold is measured by taking the other of the high and low side voltages of the clock signal as a reference voltage, and changing the peak voltage to the other voltage side.

According to the invention, two thresholds of the input circuit having hysteresis characteristic can be measured easily from the changes of the power source current when the peak voltage of the clock signal to the reference voltage is sequentially varied.

Further in the invention, the semiconductor integrated circuit includes a Schmitt circuit.

According to the invention, since the semiconductor integrated circuit includes a Schmitt circuit, and the state transition at the time when the input signal voltage exceeds the threshold showing hysteresis characteristic is reflected in the change of the power source current, the threshold characteristic can be measured promptly and accurately.

Also in the invention, the semiconductor integrated circuit is a CMOS type large scale integrated circuit.

According to the invention, since the semiconductor integrated circuit is a CMOS type large scale integrated circuit, the power source current when state transition is not occurring is very small. A large power source current flows only at the time of state transition, so that the threshold can be detected easily.

In the invention, the clock signal fed as the input signal is changed according to a predetermined test pattern to measure the threshold as a part of function test.

According to the invention, since the threshold characteristic can be measured as a part of function test, the threshold characteristic can be efficiently measured simultaneously with other test items of the semiconductor integrated circuit.

Further the invention provides an apparatus for measuring threshold characteristic of a semiconductor integrated circuit having an input circuit whose operation state varies depending on whether an input signal voltage is above or below a threshold, the apparatus comprising:

signal generating means for repeatedly generating as an input signal to be fed to a semiconductor integrated circuit, a clock signal having an amplitude within a range from a predetermined reference voltage sufficiently greater than or less than a voltage supposed to be the threshold to a peak voltage which differs by a variation amount toward the side of the voltage supposed to be the threshold, from the predetermined reference voltage, and sequentially changing the peak voltage of the clock signal by a predetermined variation amount at a time, change detecting means for detecting a change of a power source current supplied to the semiconductor integrated circuit, and measuring means for responding to an output from the change detecting means and measuring the peak voltage of the input signal outputted from the signal generating means as the threshold, when the change of the power source current exceeds a predetermined range.

According to the invention, as the input signal to the semiconductor integrated circuit, a clock signal from the signal generating means is given, and the change of the power source current of the semiconductor integrated circuit is detected by the change detecting means. The measuring means measures the threshold of the semiconductor integrated circuit from the peak voltage of the clock signal when the change of the power source current exceeds the predetermined range. Since the threshold is measured in response to the clock signal whose peak voltage changes sequentially, it is not necessary to add any circuit for facilitating measurement at the semiconductor integrated circuit side, and prompt measurement is possible.

In the invention, the signal generating means includes:

first and second digital-to-analog converting circuits for converting a digital signal entered from outside into a direct-current voltage, and a clock signal generating circuit for generating a clock signal having an amplitude ranging between direct-current voltages outputted from the first and second digital-to-analog converting circuits, wherein the measuring means feeds a digital signal corresponding to a specific voltage to become the reference voltage, to one of the first and second digital-to-analog converting circuits, and a digital signal corresponding to the voltage to become the peak voltage, changing sequentially, to the other of the first and second digital-to-analog converting circuits, and measures the peak voltage at the time when the change of the power source current detected by the change detecting means exceeds the predetermined range, as the threshold.

According to the invention, the signal generating means contains the first and second digital-to-analog converting circuits, and a clock signal ranging between output voltages of the first and second digital-to-analog converting circuits is generated from the clock signal generating circuit. Since the measuring circuit supplies a digital signal corresponding to a specific voltage to become the reference voltage, to one of the first and second digital-to-analog converting circuits, and a digital signal corresponding to the voltage changing sequentially to become the peak voltage, to the other of the first and second digital-to-analog converting circuits, the peak voltage at the time when the power source voltage is changed can be easily determined by the output from the change detecting means. By alternating the digital-to-analog converting circuit for setting as a reference voltage, and setting the reference voltage at a voltage level away from the voltage supposed to be the threshold, the threshold having hysteresis characteristic may be easily detected.

Thus, according to the invention, it is not necessary to add any circuit for facilitating measurement, to the semiconductor integrated circuit to be measured, and the threshold characteristic can be measured promptly.

Also according to the invention, the threshold of the input voltage of the semiconductor integrated circuit having hysteresis characteristic can be measured promptly without adding any circuit for facilitating measurement.

According to the invention, if the output of the Schmitt circuit itself of the semiconductor integrated circuit containing the Schmitt circuit cannot be measured directly, as a change of power source voltage, the state transition caused by application of the clock signal of the amplitude corresponding to the threshold can be effectively judged.

Further according to the invention, the threshold of the input circuit contained in the CMOS type large scale integrated circuit can be judged precisely at the moment the input voltage reaches the threshold, by making use of the phenomenon that a large current flows only when a state transition occurs in the CMOS type large scale integrated circuit.

Further according to the invention, by supplying a clock signal varying in amplitude between voltages generated by two digital-to-analog converting circuits, the threshold having hysteresis characteristic can be measured securely.

BRIEF DESCRIPTION OF THE DRAWINGS

Other and further objects, features, and advantages of the invention will be more explicit from the following detailed description taken with reference to the drawings which are given by way of illustration only, and thus are not limitative of the present invention and wherein.

DETAILED DESCRIPTION OF THE PREFERRED EMBODIMENT

Now referring to the drawings, preferred embodiments of the invention are described below.

Figure 1:
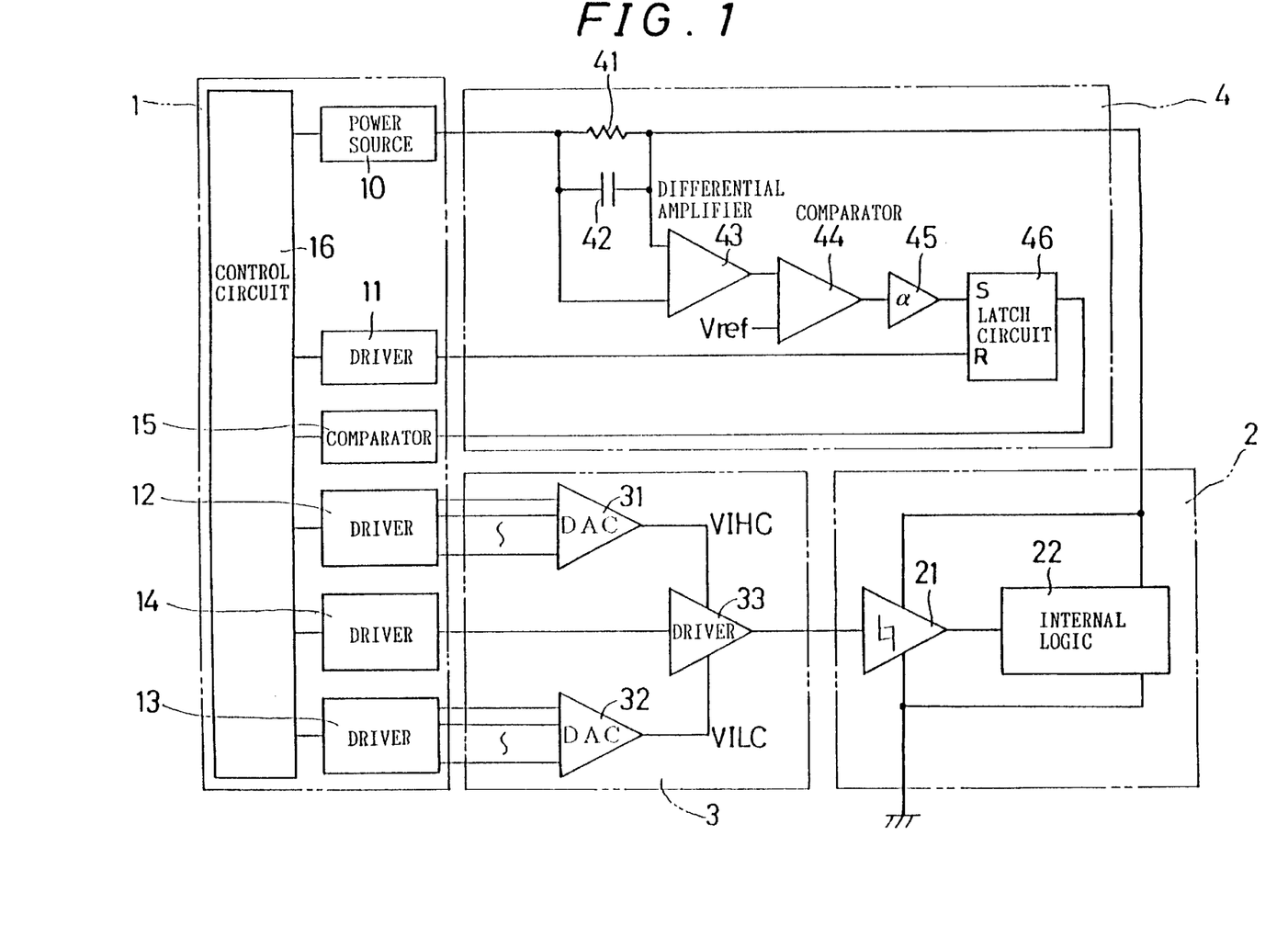
FIG. 1 is a block diagram showing a schematic electric constitution of a threshold characteristic measuring apparatus of an embodiment of the invention.

FIG. 1 shows a schematic electric constitution of a threshold measuring apparatus of an embodiment of the invention. In this embodiment, as a part of function test using a test apparatus 1, the threshold characteristic of the input side of a semiconductor integrated circuit to be inspected (i.e. device under test, which is hereinafter abbreviated as DUT) 2 is measured. An input signal of the DUT 2 is generated by a signal generator 3. In the DUT 2, a power source current is supplied from a power source circuit 10 of the test apparatus 1 through a change detecting device 4. The test apparatus 1 comprises driver circuits 11, 12, 13, and 14, a comparator circuit 15, and a control circuit 16. The DUT 2 contains an input side Schmitt circuit 21 having an external terminal at least a part of which is connected inside. The output of the Schmitt circuit 21 is given to an internal logic circuit 22, and cannot be monitored directly from the outside of the DUT 2.

The signal generator 3 includes two digital-to-analog converting (DAC) circuits 31 and 32 and a driver circuit 33. The driver circuit 33 derives a clock signal varying in amplitude between output voltages of the DAC circuits 31 and 32, and feeds it to the input side of the Schmitt circuit 21 of the DUT 2. The change detecting circuit 4 contains a resistance 41 connected between a power source circuit 10 of the test apparatus 1 and a power source terminal of the DUT 2. A capacitor 42 for phase compensation is connected parallel to the resistance 41. By the power source current flowing in the DUT 2, a voltage is generated at both ends of the resistance 41, and this voltage is output using a reference of grounding (GND) voltage by a differential amplifier circuit 43. The output voltage of the differential amplifier circuit 43 is compared with a reference voltage level Vref in a comparator circuit 44, and its output is amplified by alpha times by an amplifier circuit 45. The output of the amplifier circuit 45 is connected to a set input terminal S of a latch circuit 46 realized by an RS flip-flop or the like.

The output from the driver circuit 11 of the test apparatus 1 is fed to a reset input terminal R of the latch circuit 46. The output from the driver circuit 12 is fed to the first DAC circuit 31. The output from the driver circuit 13 is fed to the second DAC circuit 32. The output from the driver circuit 14 is fed to the input side of the driver circuit 33. The output from the latch circuit 46 is fed to the comparator circuit 15. The control circuit 16 in the test apparatus 1 once resets the latch circuit 46, and then feeds a digital signal according to a predetermined test pattern, to the DAC circuits 31 and 32 in the signal generator 3, and a clock signal which is the base of a clock signal to be fed to the Schmitt circuit 21, having an amplitude varying in a specific range, to the driver circuit 33. The output from the DAC circuit 31 determines a voltage VIHC of the high level side amplitude of a clock signal outputted from the driver circuit 33, and the output from the DAC circuit 32 determines a low level voltage VILC of the clock signal outputted from the driver circuit 33. The driver circuit 33 has a level shift function, and can vary the level of output clock signal depending on the supplied voltage.

Figure 2A:
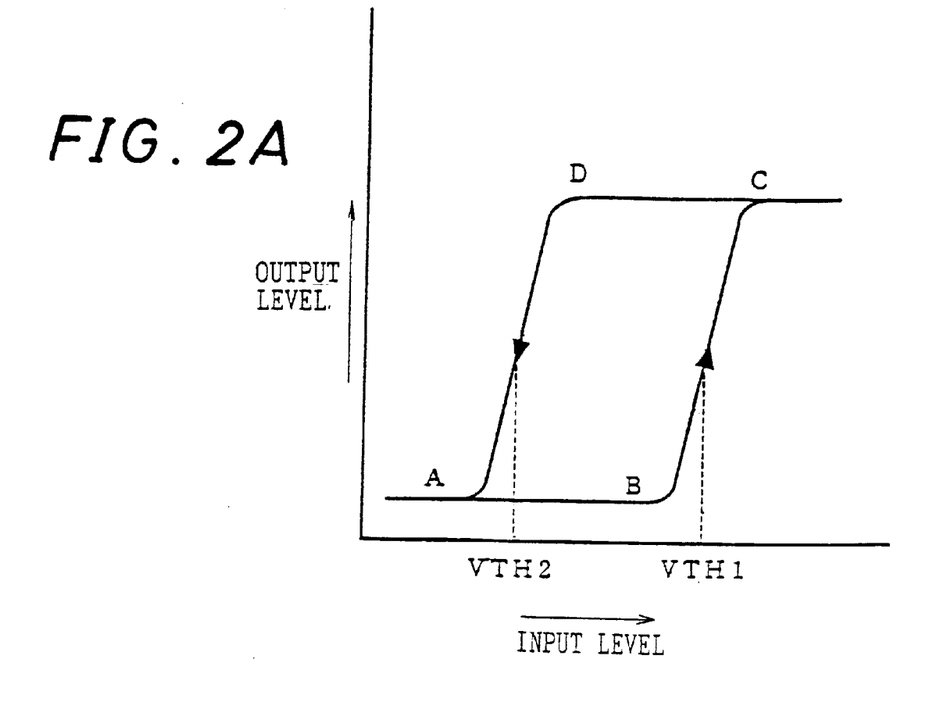
FIG. 2A is a graph of hysteresis characteristic measured by the threshold characteristic measuring apparatus in FIG. 1.
Figure 2B:
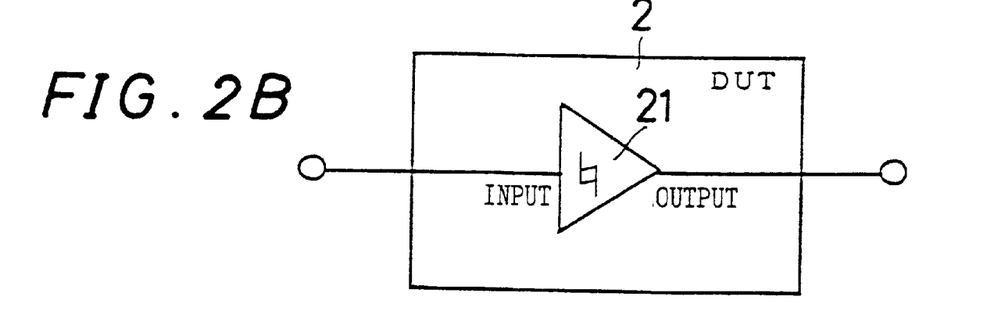
FIG. 2B is a block diagram showing a schematic structure of a Schmitt circuit.

FIG. 2A is a graph showing the hysteresis characteristic of the Schmitt circuit 21 in FIG. 1. In FIG. 2A, the axis of abscissas denotes the input level, and the axis of ordinates denotes the output level. FIG. 2B shows a schematic electric constitution of the Schmitt circuit 21. When the input level of the Schmitt circuit 21 is increased from state A of a sufficiently lower voltage than the voltage supposed to be a threshold, the input voltage exceeds state B and reaches VTH1, and the output level increases suddenly to reach state C of high level. At this time, the threshold of state transition drops to VTH2. Therefore, the input level is lowered from the state corresponding to point C to a voltage corresponding to point D beyond the voltage corresponding to point B, and the output level continues to be in the state of high level unless further lowered to a new threshold, namely VTH2. When the input level becomes lower than the second threshold VTH2, the output level drops suddenly to be in the state of low level represented by point A.

Figure 3:
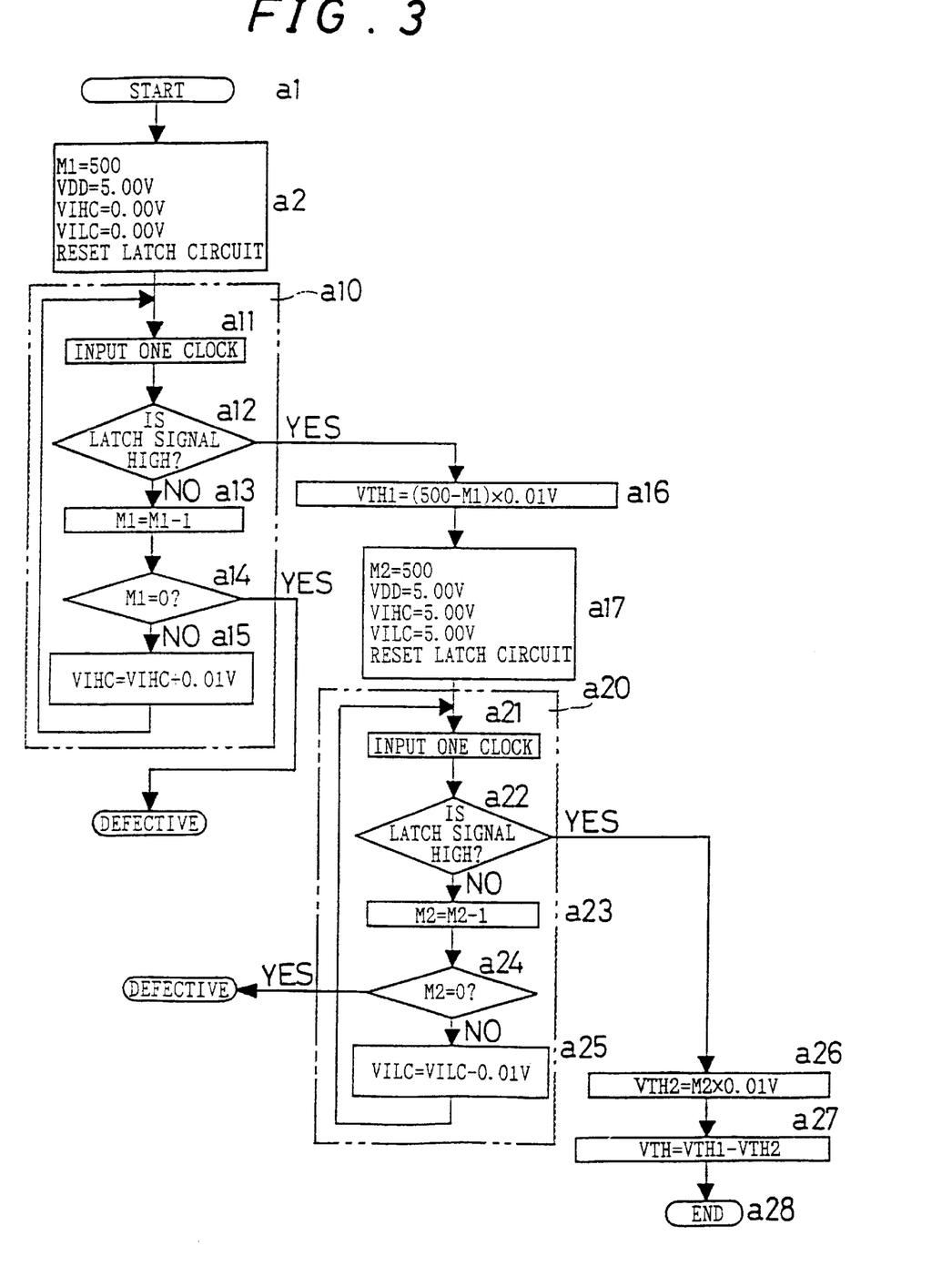
FIG. 3 is a flowchart showing the operation of a test apparatus in FIG. 1.

FIG. 3 shows the operation of the test apparatus 1 in FIG. 1. Operation is started at step a1, and initial setting for a first function test 1 is done at step a2. In the initial setting, the count number M1 is set at 500, the supply voltage VDD at 5.00 V, the high level clock signal voltage VIHC at 0.00 V, and the low level clock signal voltage VILC at 0.00 V, and the latch circuit 46 is reset. Next, as the function test 1 of step a10, an input signal is given to the DUT 2 for the period of one clock at step a11, and the output from the latch circuit 46 is compared in the comparator circuit 15 at step a12 to judge whether the output reaches a high level or not. If not reaching the high level, at step a13 the value of the counter M1 is decreased by one, and the process goes to step a14. At step a14 it is judged whether the value of the counter M1 is 0 or not. If not 0, at step a15 the voltage VIHC of the high level side of the clock signal is increased by 0.01 V, and the process returns to step a11. When the value of the counter M1 is 0 at step a14, the DUT 2 does not cause state transition, and it is judged to be defective. When the level of the latch signal is judged at step a12 to be high, it is judged that the DUT 2 has caused state transition by the clock signal of that time, and the process goes to step a16. At step a16, (500−M1)×0.01 V is obtained as the first threshold VTH1.

Consequently, at step a17 initial setting for a second function test 2 is done. The counter value M2 is set at 500, the supply voltage VDD at 5.00 V, and both the high level clock signal voltage VIHC and the low level clock signal voltage VILC at 5.00 V, and the latch circuit 46 is reset. At step a20, the second function test 2 is done. At step s21, an input signal for one clock is fed to the DUT 2, and it is judged at step a22 whether the level of the signal from the latch circuit 46 is high or not. If not high, the counter value M2 is decreased by one at step s23, and it is judged at step a24 whether the value of M2 is 0 or not. If not 0, the low level clock signal voltage VILC is decreased by 0.01 V at step a25, and the process returns to step a21. If the count value M2 is 0 at step a24, state transition does not occur at the DUT 2, and it is judged to be defective. If the level of the latch signal is high at step a22, it is judged that the DUT 2 has caused state transition, and the count value M2×0.01 V is fed to the second threshold VTH2 at step a26. At step a27, as the threshold difference ΔVTH, the balance of subtracting the second threshold VTH2 from the first threshold VTH1 is obtained. The operation terminates at step a28.

Figure 4:
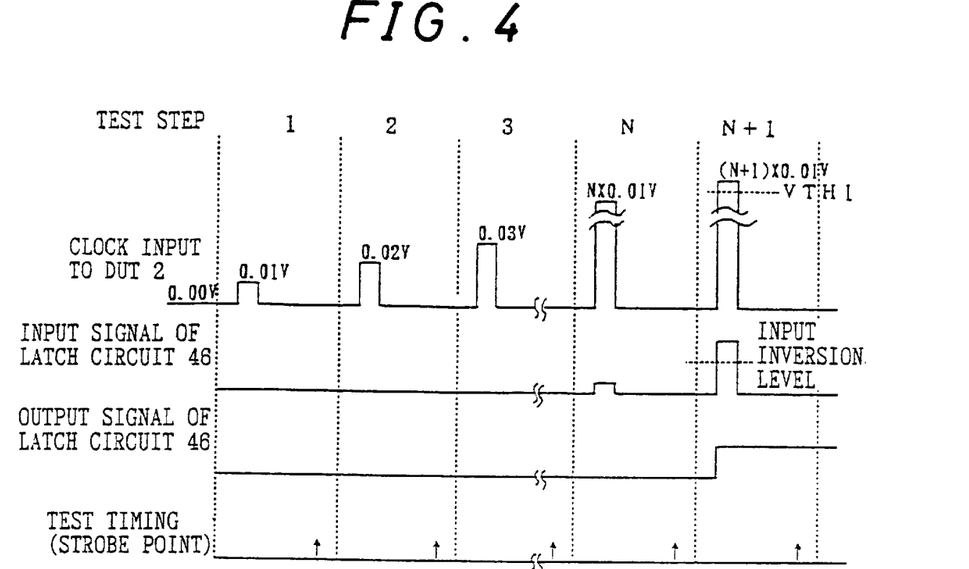
FIG. 4 is a time chart showing signals generated in function test 1 shown in FIG. 3.

FIG. 4 shows the operation timing of the function test 1 at step a10 in FIG. 3. The input signal of the DUT 2 becomes a pulse signal increasing in peak voltage by 0.01 V at every test step, with a reference voltage of 0.00 V. Until test step N, the peak voltage does not reach the first threshold VTH1, and the Schmitt circuit 21 does not cause state transition. Accordingly a signal to be entered in the set input terminal of the latch circuit 46 is hardly generated. At test step N+1, since the peak voltage of the clock signal exceeds the threshold VTH1, a large power source current on the basis of the state transition of the Schmitt circuit 21 flows, which is detected as a voltage drop of the resistance 41, and an input signal exceeding its input inversion level is fed also to the set input terminal S of the latch circuit 46, and the output level of the latch circuit 46 reset in the initial setting is changed to high level. The output level of the latch circuit 46 is judged at the strobe point of test timing given to the comparator circuit 15, and at test step N+1 the output level is ascertained to exceed the threshold VTH1.

Figure 5:
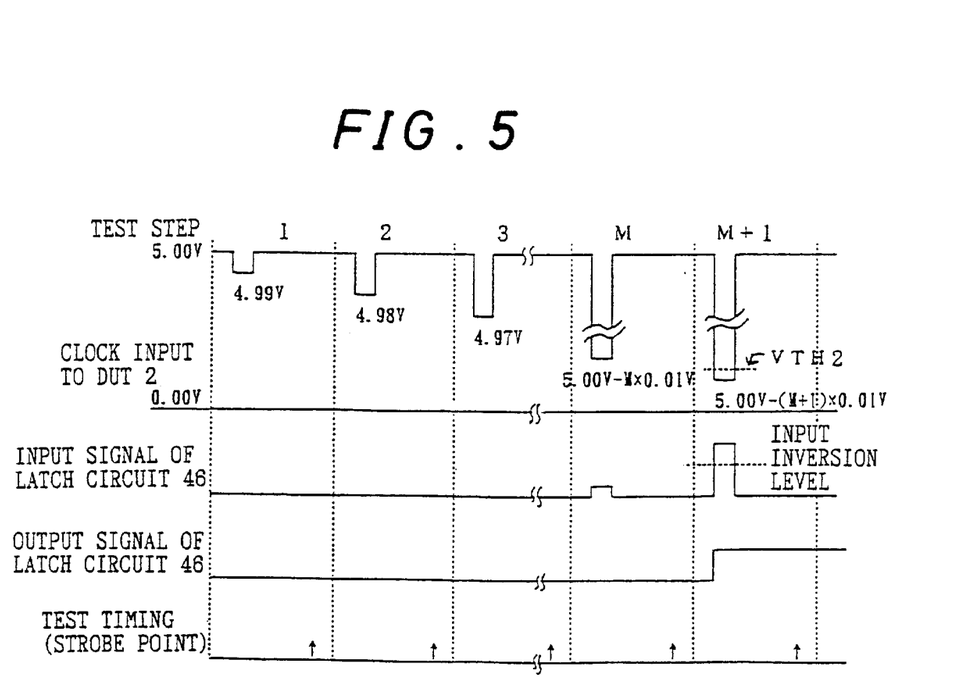
FIG. 5 is a time chart showing signals generated in function test 2 shown in FIG. 3.

FIG. 5 shows a signal waveform in the function test 2 at step a20 in FIG. 3. The clock signal fed as an input signal to the DUT 2 is a repeating signal decreasing in peak voltage to 0.00 V side at every step by 0.01 V, with a reference voltage of 5.00 V. In the range where the peak voltage exceeds the threshold VTH2, state transition of the Schmitt circuit 21 does not take place, and the current flowing in the DUT 2 hardly changes, and the input signal detected by the resistance 41 and fed to the set input terminal S of the latch circuit 46 is hardly changed. At test step M+1 where the peak voltage of the clock signal is smaller than the threshold VTH2, a large power source current flows due to state transition of the Schmitt circuit 21, and the input signal detected by the resistance 41 and fed to the set input terminal S of the latch circuit 46 comes to exceed the input inversion level of the latch circuit 46. As a result, after test step M+1, the output of the latch circuit 46 is changed from the state of low level reset in the initial setting to the state of high level. The output level of the latch circuit 46 is detected by the control circuit 16 in the comparator 15 at the test timing shown in FIG. 5.

Figure 6:
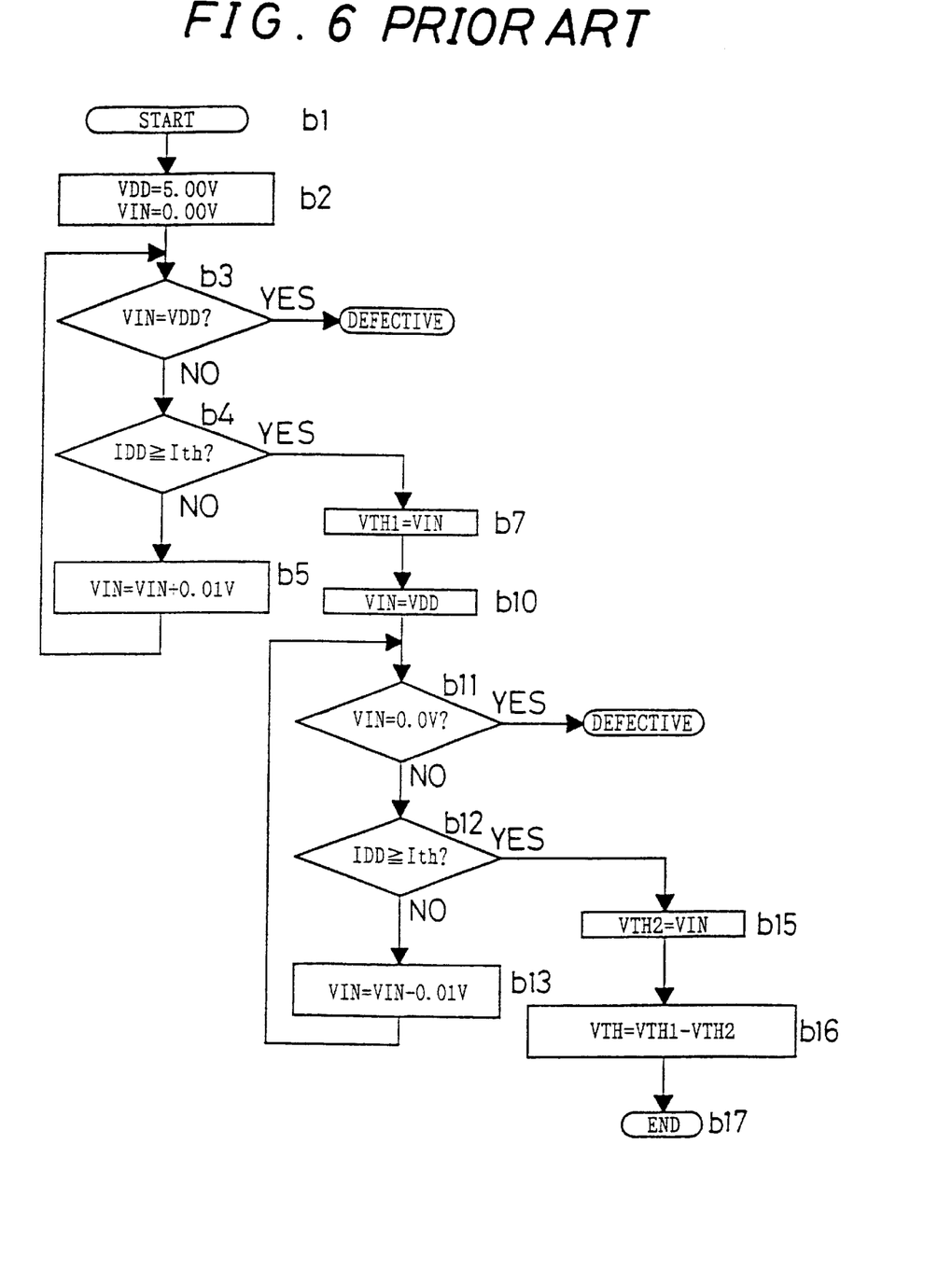
FIG. 6 is a flowchart of imaginary operation of threshold characteristic measurement of a prior art.

In the case of the DUT 2 composed of a CMOS type semiconductor integrated circuit, when supply voltage VDD=5.00 V, a current of only about several microamperes flows, unless state transition occurs. When state transition occurs in the Schmitt circuit 21, a current of about hundreds of microamperes to about 1 mA flows as a penetration current for one transistor. As the resistance 41, for example, if a resistance of about 100 ohms is inserted, a drop of supply voltage due to the resistance 41 can be almost ignored, and the change of the power source current can be detected sufficiently. Though measurement is easiest in the case where CMOS type large scale integrated circuit is used as the DUT 2, also in the case of MOS type semiconductor integrated circuit of other type or bipolar semiconductor integrated circuit, the change of threshold characteristic can be measured by detecting a change in power source current, because the power source current changes when state transition takes place, as compared with the case where state transition does not takes place. FIG. 6 shows an operation in the case of threshold measurement according to the prior art disclosed in JP-A 63-238474 is conducted. The operation is started from step b1, the supply voltage VDD of the Schmitt circuit is set at 5.00 V and the input voltage VIN of the Schmitt circuit is initially set at 0.00 V at step b2. At step b3, it is judged whether VIN and VDD are equal or not. If not equal, at step b4 it is judged whether the power source current IDD of the Schmitt circuit exceeds the threshold Ith or not. If IDD is less than Ith, VIN is increased by 0.1 V at step b5, and the process returns to step b3. If VIN and VDD are equal at step b3, state transition is not caused in the Schmitt circuit, and it is judged to be defective. If the power source current IDD is judged to exceed the threshold Ith at step b4, it is judged that state transition has occurred in the Schmitt circuit, and the input voltage VIN at this time is set as the threshold VTH1 at step b7.

Consequently, at step b10, when the input voltage VIN of the Schmitt circuit is equal to the supply voltage VDD, initialization is conducted. At step b11, it is judged whether the input voltage VIN is 0.00 V or not. If not, at step b12 it is judged whether the power source current IDD is more than the threshold Ith or not. If IDD is less than Ith, at step b13 the value of VIN is decreased by 0.01 V, and the process returns to step b11. If VIN is 0.00 V at step b11, state transition does not occur in the Schmitt circuit even if the input voltage is lowered, and it is judged to be defective. If it is judged that the power source current IDD exceeds the threshold Ith at step b12, the input voltage VIN at that time is obtained as the threshold VTH at step b15. At step b16, the difference ΔVTH of the threshold VTH1 and threshold VTH2 is determined, and the operation terminates at step b17.

Since measurement in FIG. 6 is done as DC test, and it takes time until the power source current IDD is stabilized, and the time required for judgment when the input voltage is sequentially increased by 0.01 V at a time is about 3 ms. In the embodiment, by contrast, at the clock period of about 0.04 ms per step in the operation in FIG. 3, the threshold can be sufficiently detected, and the operating speed is increased substantially. In FIG. 4 and FIG. 5, the clock signal changing in the form of pulse from the reference voltage to the peak voltage is fed as an input signal at each test step, but alternatively an input signal of stepwise waveform kept at the level of the peak voltage through the period of each test step may be also used.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A method for measuring a threshold characteristic of a semiconductor integrated circuit having an operational state which is shifted depending on whether an input signal voltage is above or below a threshold, said method comprising the steps of:

inputting a clock signal into the integrated circuit, the clock signal having a predetermined reference voltage which is significantly greater than or less than an approximate threshold voltage and a peak voltage which is offset by a variation amount toward the approximate threshold voltage from the predetermined reference voltage;

measuring a current level supplied from a power source to the semiconductor integrated circuit;

changing the peak voltage of the clock signal by a predetermined amount to obtain an updated clock signal;

inputting the updated clock signal into the semiconductor integrated circuit;

repeating the step of measuring the current level supplied from the power source to the semiconductor integrated circuit to obtain an updated current level; and determining whether the updated current level differs from the current level obtained by the previous measuring step by more than a predetermined amount and, if so, deciding that the peak voltage of the updated clock signal is the threshold.

2. The method for measuring a threshold characteristic of a semiconductor integrated circuit of claim 1, wherein the hysteresis characteristic of the threshold voltage for peak voltage changes from a high voltage side to a low voltage side, is different than that for peak voltage changes from a low voltage side to a high voltage side, and a first threshold is measured by setting a first predetermined reference, voltage of the clock signal at a level significantly greater than an approximate first threshold voltage, and repeatedly decreasing the peak voltage of the clock signal, and a second threshold is measured by setting a second predetermined voltage of the clock signal at a level significantly less than an approximate second threshold voltage, and repeatedly increasing the peak voltage of the clock signal.

3. The method for measuring a threshold characteristic of a semiconductor integrated circuit of claim 2, wherein the semiconductor integrated circuit includes a Schmitt circuit.

4. The method for measuring a threshold characteristic of a semiconductor integrated circuit of claim 1, wherein the semiconductor integrated circuit is a CMOS type large scale integrated circuit.

5. The method for measuring a threshold characteristic of a semiconductor integrated circuit of claim 1, wherein the clock signal fed as the input signal is changed according to a predetermined test pattern to measure the threshold as a part of function test.

6. An apparatus for measuring a threshold characteristic of a semiconductor integrated circuit having an input circuit whose operation state varies depending on whether an input signal voltage is above or below a threshold, the apparatus comprising:

signal generating means for repeatedly generating as an input signal to be fed to the semiconductor integrated circuit, a clock signal having an amplitude within a range from a predetermined reference voltage which is significantly greater or less than an approximate threshold voltage to a peak voltage which differs by a variation amount toward the approximate threshold voltage from the predetermined reference voltage, and sequentially changing the peak voltage of the clock signal by a predetermined variation amount at a time;

change detecting means for detecting a change of a power source current supplied to the semiconductor integrated circuit; and measuring means for responding to an output from the change detecting means and measuring the peak voltage of the input signal outputted from the signal generating means as the threshold, when the change of the power source current exceeds a predetermined range.

7. The apparatus for measuring threshold characteristic of a semiconductor integrated circuit of claim 6, wherein the signal generating means includes:

first and second digital-to-analog converting circuits for converting an input digital signal into a direct-current voltage, and a clock signal generating circuit for generating a clock signal having an amplitude ranging between direct-current voltages output from the first and second digital-to-analog converting circuits, and the measuring means feeds a digital signal corresponding to a specific voltage to be used as the reference voltage to one of the first and second digital-to-analog converting circuits, feeds a digital signal corresponding to the voltage to be used as the peak voltage to the other of the first and second digital-to-analog converting circuits, and measures the peak voltage at the time when the change of the power source current detected by the change detecting means exceeds the predetermined range as the threshold.

8. A method for measuring threshold characteristics of an integrated circuit which includes a input circuit having an operation state which varies depending on whether an input signal voltage is above or below a threshold, said method comprising the steps of:

(a) setting a first reference signal at a predetermined voltage level which is significantly greater than or less than an approximate threshold level;

(b) setting a first peak voltage at the first reference voltage level;

(c) inputting a clock signal to the integrated circuit, the clock signal varying between the first reference signal and the first peak voltage;

(d) determining whether a current signal output from the integrated circuit indicates that a threshold level has been reached and deciding that the input first peak voltage is a first threshold value when the output current signal indicates that a threshold level has been reached;

(e) when said step (d) does not indicate that a threshold level has been reached, changing the first peak voltage by a predetermined amount; and (f) repeating said steps (c)–(e) until it is indicated that either a threshold level has been reached or that an entire range of potential first peak voltages has been input to the integrated circuit.

9. A method according to claim 8, further comprising the steps of:

(g) setting a second reference signal at a predetermined voltage level which is on the other side of an approximate threshold level than the first reference signal;

(h) setting a second peak voltage at the second reference voltage level;

(i) inputting a clock signal to the integrated circuit, the clock signal varying between the second reference signal and the second peak voltage;

(j) determining whether a current signal output from the integrated circuit indicates that a threshold level has been reached and deciding that the input second peak voltage is a second threshold value when the output current signal indicates that a threshold level has been reached;

(k) when said step (j) does not indicate that a threshold level has been reached, changing the second peak voltage by a predetermined amount; and (l) repeating said steps (i)–(k) until is indicated that a threshold level has been reached or that an entire range of potential second peak voltages has been input to the integrated circuit.

10. The method according to claim 8, wherein the input circuit is a Schmitt circuit.

11. An apparatus for measuring threshold characteristics of an integrated circuit which includes an input circuit having an operation state which varies depending on whether an input signal voltage is above or below a threshold, said apparatus comprising;

- a signal generator which generates a reference signal which is significantly greater or less than an approximate threshold level, an adjustable peak voltage which is sequentially adjusted toward the approximate threshold level, and a clock signal which varies between the generated reference signal and the adjustable peak voltage;
- a change detector which detects when a current signal output by the integrated circuit indicates that a threshold level has been reached; and
- a test circuit for determining, as a threshold level, the peak voltage resulting in an indication from said change detector that a threshold level had been reached.

12. The apparatus according to claim 11, wherein said signal generator includes a first digital-to-analog convertor for generating the reference signal, a second digital-to-analog convertor for generating the peak voltage, and a driver which receives the reference signal and peak voltage and outputs the clock signal to the integrated circuit.

13. The apparatus according to claim 12, wherein said first and second digital-to-analog convertors and said driver are controlled by said test circuit.

14. The apparatus according to claim 11, wherein said change detector includes a differential amplifier and an RS flip-flop.

15. The apparatus according to claim 11, wherein the input circuit is a Schmitt circuit.

* * * * *